United States Patent [19]
Bayer et al.

[11] Patent Number: 6,150,435
[45] Date of Patent: Nov. 21, 2000

[54] ONE-COMPONENT EPOXY RESIN FOR COVERING ELECTRONIC COMPONENTS

[75] Inventors: Heiner Bayer, Olching; Barbara Lehner; Ernst Wipfelder, both of Munich, all of Germany

[73] Assignee: Siemens Aktiengesellschaft, Munich, Germany

[21] Appl. No.: 09/190,647

[22] Filed: Nov. 12, 1998

[30] Foreign Application Priority Data

Nov. 12, 1997 [DE] Germany .............................. 197 50 147

[51] Int. Cl.7 ................................. C08J 3/00; C08K 3/34; C08L 63/00; C08F 283/00; C08G 65/48
[52] U.S. Cl. ........................... 523/434; 522/170; 523/400; 523/427; 524/492; 524/493; 525/396; 525/481; 525/523; 525/524; 528/87; 528/103
[58] Field of Search ..................................... 523/400, 427, 523/434; 524/492, 493; 525/396, 481, 523, 524; 528/87, 103; 522/170

[56] References Cited

U.S. PATENT DOCUMENTS 5,900,286  5/1999  Bayer et al. ............................. 427/510

FOREIGN PATENT DOCUMENTS 0 504 569 A2  5/1992  European Pat. Off. .

*Primary Examiner*—Patrick D. Niland
*Attorney, Agent, or Firm*—Hill & Simpson

[57] ABSTRACT

A one-component epoxy resin for coverage of bare chips and for underfilling of flip chips is disclosed. Two polyol components are combined in the inventive epoxy resin which decidedly improve the properties of the resin with respect to coefficient of expansion, shrinkage stress, substrate adhesion, and reactivity.

12 Claims, No Drawings

ONE-COMPONENT EPOXY RESIN FOR COVERING ELECTRONIC COMPONENTS

FIELD OF THE INVENTION

The invention relates to one-component epoxy resins for Coverage of unhoused electronic components such as bare chips for application in chip cards and for underfilling of flip chips as they occur in multi-chip modules and chip size packages.

BACKGROUND OF THE INVENTION

Thermally hardenable two-component epoxy resins are known which must either be mixed prior to processing or stored as master-batches at low temperatures (e.g. −40° C.) and which then have a potlife of only a few hours at processing temperatures. Furthermore, there are UV hardenable and partially thermally hardenable one-component resins in the prior art which provide relatively slow UV reactivities (e.g. minutes) and usually cannot forgo a thermal step at temperatures >120° C. for after-baking. This typically leads to the freezing of shrinkage stresses during the hardening and cooling.

Thus, there is a need for a one-component epoxy resin which has an improved adhesion and faster UV and thermal reactivity given good expansion behavior, so that lower shrinkage stresses arise with improved adhesion for the coverage of electronic components.

SUMMARY OF THE INVENTION

According to the present invention, it has been found that not only the adhesion but also the thermal and UV reactivity of one-component epoxy resins can be decidedly improved by the utilization of polyols in epoxy resin formulas as these polyols are widely used in polyurethane chemistry. The inventive epoxy resin is designed for specific demands, and in addition to a coefficient of expansion adapted to the substrate it provides improved adhesion, even on flexible plastics, the importance of which continues to increase.

In an embodiment, the present invention provides a one-component epoxy resin comprising the following components:

A) 2–30 weight % of a first polyol component comprising a hydroxy-functionally pre-reacted compound;
B) 5–60 weight % of a second polyol component;
C) 5–90 weight % of an epoxide;
D) 0–90 weight % of a filling substance; and
E) 0.02–10 weight % of an initiator mixture comprising two components in an amount of 0.01 to 5 weight %, respectively, whereby the first component is UV reactive and the second component is thermally reactive.

In an embodiment, the one-component epoxy resin of the present invention is used for chip coverage and particularly for chip coverage on flexible substrates.

In an embodiment, the hydroxy-functional pre-reacted compound is a product of a reaction of a phenolic component with a cycloaliphatic diepoxide.

In an embodiment, the second polyol component comprises a compound selected from the group consisting of trimethylolpropane, ethoxylated trimethylolpropane, propoxylated trimethylolpropane and tricyclodecanedimethanol.

In an embodiment, the filler comprises a translucent fused quartz filler.

In an embodiment, the epoxide component comprises a compound selected from the group consisting of an epoxidated olefin, an epoxidated diolefins and an expoxidated polyolefin.

In an embodiment, the initiator comprises a triarylsulfonium salt and a benzylthiolanium salt.

In an embodiment, the present invention provides a method for covering a chip with an epoxy resin that comprises the step of covering the chip with the epoxy resin of the present invention.

In an embodiment, the present invention provides a method of covering a flexible substrate with an epoxy resin that comprises the step of covering the flexible substrate with the epoxy resin of the present invention.

Other objects and advantages of the invention will become apparent upon reading the following detailed description and appended claims, and upon reference to the accompanying drawings.

DETAILED DESCRIPTION OF THE PRESENTLY PREFERRED EMBODIMENTS

The one-component epoxy resin a compound of the components A to E has proven advantageous in the following ranges, whereby the narrower ranges are always ranges which are preferred over the broader ranges:

between 2 and 30 weight % or between 5 and 25 weight % or between 10 and 20 weight % of the first polyol component A between 5 and 60 weight % or between 8 and 50 weight % or between 10 and 40 weight % of the second polyol component B between 5 and 90 weight % or between 15 and 80 weight % or between 30 and 70 weight % of the epoxide component C between 0 and 90 weight % or between 10 and 80 weight % or between 30 and 70 weight % of the filling substance component D between 0.02 and 10 weight % or between 0.2 and 6 weight % or between 1 and 3 weight % of the initiator mixture E.

A compound obtained by reaction of epoxide compounds with alcohols or phenols is preferably used as first polyol component. The first polyol component is preferably of greater molecular weight and has a longer chain than the second polyol component. The addition product of a cycloaliphatic epoxide with a polyphenol, preferably with a bisphenol such as bisphenol A or naphthalene diol is suitable. Such addition products can be obtained given base catalysis under mild conditions. A preferred addition product is the 2:1 adduct wherein one equivalent of phenolic groups is replaced by two equivalent epoxide groups. Based on one diepoxide and one bisphenol, the 2:1 adduct is likewise a diepoxide. If the mole ratio is selected in the range of 2:1 to 20:1 and preferably from 3:1 to 10:1, then the adduct, or respectively, the reaction mixture containing the adduct practically does not comprise any more free phenolic OH groups. The reaction mixture contains hydroxyl groups, however, since a β-constant hydroxy group arises in addition to the ether bond by addition of a phenol to the epoxide group.

In this context DE 19,751,738.2 "Halogen-free Epoxy Resin" (not yet published) is cited, the disclosure of which is incorporated by reference. The invention described therein relates to hydroxy-functionally pre-reacted compounds as they are preferably used as the A-component in the inventive one-component epoxy resin.

One of the following compounds containing hydroxyl groups is preferably used as second polyol component: generally polyvalent or polyhydric aliphatic or cycloaliphatic alcohols; glycols or other aliphatic diols, trifunctional or tetrafunctional alcohols such as trimethylolpropane or ethoxylated or propoxylated trimethylolpropane or tricyclodecanedimethanol or ether of glycols with phenols or bisphenols can thus be used, for example; other suitable compounds are polymer polyols, which occur in the production of polyurethanes. The polyols marketed by Dow Chemical under the names Niax™ and Tone™ are exemplarily mentioned here. The second polyol component is preferably of lower molecular weight and has a shorter chain than the first polyol component.

In a preferred embodiment of the invention an ethoxylated trimethylolpropane or ethoxylated or propoxylated trimethylolpropane or tricyclodecanedimethanol is preferably used as second polyol component.

One of the following compounds is preferably used as epoxide: linear aliphatic epoxide, epoxidized olefins, diolefins and/or polyolefins such as epoxidized polybutadiene and/or epoxidized soybean oil.

Cycloaliphatic epoxides such as 3,4-epoxycyclohexylmethyl-3',4',-epoxycyclohexanecarboxylate are particularly suitable as epoxide, however. These are distinguished particularly by a high reactivity and a low viscosity. Mixtures of other cationically hardenable epoxides can also be added.

If the first polyol, which is used as a conversion or transposition product and not as pure substance following isolation, is produced with high epoxide excess, then the contained epoxide can represent a part or all of the epoxy component.

A mixture of UV reactive and thermally reactive components such as is described and protected in EP 0,504,569 (which is also incorporated herein by reference) is preferably used as initiator mixture. In order to avoid unnecessary repetitions the disclosure contents of this older application is therefore incorporated as subject matter of this specification.

A cationic photoinitiator or a cationic photoinitiator system is included for the initiation of the cationic hardening. The share thereof in the total epoxy resin can comprise 0.1 to 5 weight %. Given UV irradiation these photointiators release reactive cations such as protons which initiate the cationic hardening process of the epoxy resin. The photoinitiators are therein derived from stable organic onium salts, particularly with nitrogen, phosphorus, oxygen, sulfur, selenium or iodine as central atom of the cation. Aromatic sulfonium and iodonium salts with complex anions have proven particularly advantageous. A photoinitiator which releases a Lewis acid and which is realized as π donor transition metal complex, for example, is also possible. Phenacylsulfonium salts, hydroxylphenylsulfonium salts and sulfoxonium salts should also be mentioned as possibilities. Furthermore, onium salts can also be used which are not excited for acid formation directly but rather via a sensitizer. Organic silicon compounds which respectively release a silanol given UV irradiation in the presence of aluminous organic compounds can also be used as photoinitiators for the cationic hardening process.

A thiolanium salt is included as latent thermal initiator for the cationic polymerization, preferably of the general structure:

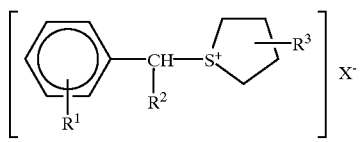

whereby R1 as hydrogen, alkyl, aryl, alkoxy, thioether, halogen, CN as or $NO_2$; R2 hydrogen, alkyl or aryl; R3 as hydrogen, alkyl, aryl or an aromatic system condensed at the thiolane ring; $X^-=PF_6^-$, $AsF_6^-$ or $SbF_6^-$.

Unsubstituted benzylthiolanium salts are preferably used therein, particularly benzylthiolaniumhexafluoroantimonate. Besides the components already listed above, other additives known per se can be contained in the inventive epoxy resin such as dyes, pigments, wetting agents, running agents, adhesives, thixotropic agents, anti-foaming agents, flow modifiers, stabilizers, flame retardants or other fillers. Additional properties such as color, specific rheological properties, intense inflammability, etc. can thereby be imparted to the epoxy resin.

Mineral powders on a basis of silicic acid, particularly quartz powders or translucent fused quartz or vitreous fused silica powder are used as fillers. These fillers are utilized to lower the thermal coefficient of expansion of a cast resin. It can thus be significant if the cast resin contains a high filler content while maintaining good flow properties. The inventive epoxy resin can contain high proportions of filler (over 65 weight % and up to 90 weight % of a translucent fused quartz filler).

In a preferred embodiment of the invention in order to achieve a good flow behavior given the high proportion of filler material, fillers fused in round fashion are used, preferably consisting of translucent fused quartz.

A chip carrier is therein designated as "flexible substrate", this consisting of epoxy resin film reinforced with glass fiber, polybutyleneterephthalate, liquid crystal polymer, polyphenylsulfide or a similar material. The inventive epoxy resin adheres well on such a flexible substrate, whereby a shear strength of up to 7 $N/mm^2$ with a mean value of 3 to 4.5 $N/mm^2$ is achieved. The inventive resin also adheres to many other thermoplastics such as PVC.

In the production of the inventive epoxy resin the two polyol components are weighed in with the epoxide component and homogenized in a slightly heated condition. In the cooling the initiator mixture is stirred in until the constituents are completely dissolved. The addition of filler subsequently ensues.

With the inventive epoxy resin formulas the thermal reactivity and the UV reactivity have been successfully accelerated such that high reaction conversions can be achieved after only a few seconds of UV irradiation. Additional conversions ensue in a few hours or days at room temperature or by means of moderate thermal processes. With this gentle hardening process (under 100° C. as a rule), lower shrinkage stresses arise in comparison to the conventional high hardening temperatures (150–180° C.).

The good adhesion behavior of epoxy resins is achieved particularly by the use of the first polyol component, the pre-reacted compound containing hydroxyl. This represents a resin constituent of greater molecular weight and with a longer chain which lowers the cross-linking density without reducing the glass temperature of the epoxy resin excessively. This constituent essentially improves adhesion and reduces the share of reactive groups, thus reducing reaction shrinkage. The pre-reaction product in itself does not necessarily promote the reaction rate. For high cross-linking rate it must be mixed with the second polyol component, a polyol of low molecular weight.

The use of a specific spherical translucent fused quartz filler permits high degrees of filling (to over 65 weight %) with good flow behavior.

The invention is further detailed below with the aid of concrete epoxy resin compounds and the appertaining exemplifying embodiments:

Exemplifying embodiment:

(1) 3.72% component A: hydroxy-functional pre-reacted compound;

(2) 3.00% component B: ethoxilatedtrimethylolpropane (Aldrich);

(3) component C: 18.87% cycloaliphaticdiepoxide (CY 197, Ciba-Geigy);

(4) 3.55% component C: epoxidated soybean oil;

(5) 0.11% additive: glycidyloxypropyltrimethoxysiloxane (Silan A 187, UCC);

(6) 0.06% additive: acrylic resin (Modaflow, Monsanto);

(7) 0.40% component E: triarylsulfonium hexafluoroantimonate (Cyracure UVI 6974, UCC);

(8) 0.29% component E: benzylthiolanium hexafluoroantimonate (PI 55, Aldrich); and (9) component D: 70.00% translucent fused quartz (FB-74 Denka).

Production of the mixture:

The resin constituents (1)–(6) are weighed into an amber glass flask and homogenized at 50° C. with the magnetic stirrer (ca. 1h). The constituents (7) and (8) are weighed in and stirred under slow cooling until constituent (8) is dissolved completely. The mixing in of the filler ensues with the toothed disc at 3000 U/min., whereby a heating of the mixture to >40° C. should be avoided. Next, there is degassing for 15 minutes at <1 mbar with stirring.

Other formulas:

From the above description it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

We claim:

1. A one-component epoxy resin comprising:
   A) 10–30 weight % of a first polyol component comprising a hydroxy-functional pre-reacted compound, the first polyol component having a first molecular weight;
   B) 10–60 weight % of a second polyol component having a second molecular weight that is less than the first molecular weight;
   C) 5–90 weight % of an epoxide;
   D) 0–90 weight % of a filler; and
   E) an initiator in an amount of 0.01 to 5 weight %, the initiator comprising a first component and a second component, the first component being UV reactive and the second component being thermally reactive.

2. The epoxy resin of claim 1 wherein the hydroxy-functional pre-reacted compound is a product of a reaction of a phenolic component with a cycloaliphatic diepoxide.

3. The epoxy resin of claim 1 wherein the second polyol component comprises a compound selected from the group consisting of trimethylolpropane, ethoxylated trimethylolpropane, propoxylated trimethylolpropane and tricyclodecanedimethanol.

4. The epoxy resin of claim 1 wherein the filler comprises a translucent fused quartz filler.

5. The epoxy resin of claim 1 wherein the epoxide component comprises a compound selected from the group consisting of an epoxidated olefin, an epoxidated diolefins and an expoxidated polyolefin.

6. The epoxy resin of claim 1 wherein the initiator comprises a triarylsulfonium salt and a benzylthiolanium salt.

|  | LX-85/01 | LX-85/02 | LX-85/03 |
|---|---|---|---|
| OH117 | 6.5 | 6.5 | 6.5 |
| CY 179 | 33.0 | 33.0 | 33.0 |
| Edenol D 82 | 6.2 | 6.2 | 6.2 |
| eo-TMP 4/156 | 5.25 | 5.25 | 5.25 |
| Silan A 187 | 0.2 | 0.2 | 0.2 |
| Modaflow | 0.1 | 0.1 | 0.1 |
| UVI 6974 | 0.7 | 0.7 | 0.7 |
| PI 55 | 0.5 | 0.5 | 0.5 |
| FB-3 S(X) | 78.7 | | |
| FB-74 | | 96.5 | 96.5 |
| Viscosity [Pas] | 16.6 | 16.6 | 16.6 |
| (D = 78 $s^{-1}$) | 16.6 | 16.6 | 16.6 |
| To. Enthalpy [J/g] | 197 (28.8.97) | 171 (28.8.97) | |
| Tg [°C.] | 103 (3.9.97) | 112 (28.8.97) | |
| After 1.5 J/$cm^2$ UV residual reaction [%] | 21.8 (28.8.97) | 28.9 (28.8.97) | 27.8 (refers to tot. enth. = 171 J/g) |
| Tg [°C.] | 119 (28.8.97) | 97 (3.9.97) | |
| After 9 J/$cm^2$ UV residual reaction [%] | 17.2 (28.8.97) | 18.6 (28.8.97) | 27.8 (refers to total enth. = 171 J/g) |
| Tg [°C.] | 106 (28.8.97) | 95 (3.9.97) | 125 (28.8.97) |
| 1.5 J/$cm^2$ UV residual reaction [%] | n. 5 d orientation RT 8.8 (2.9.97) | n. 5/6 d orientation RT 10.8 (2.9.97) | n. 6 d orientation RT 9.7 (3.9.97) |
| Tg [°C.] | 92 (2.9.97) | | 93 (3.9.97) |
| After 9 J/$cm^2$ UV residual reaction [%] | n. 5 d orientation RT 7.4 (2.9.97) | 9.9 (3.9.97) | 9.7 (3.9.97) |
| Tg [°C.] | 92 (2.9.97) | 88 (3.9.97) | 94 (3.9.97) |

7. A one-component epoxy resin comprising:
A) 10–20 weight % of a first polyol component comprising a hydroxy-functional pre-reacted compound the first polyol component having a first molecular weight;
B) 10–40 weight % of a second polyol component, having a second molecular weight that is less than the first molecular weight;
C) 30–70 weight % of an epoxide;
D) 30–70 weight % of a filler; and
E) an initiator in an amount of 1–3 weight %, the initiator comprising a first component and a second component, the first component being UV reactive and the second component being thermally reactive.

8. The epoxy resin of claim 7 wherein the hydroxy-functional pre-reacted compound is a product of a reaction of a phenolic component with a cycloaliphatic diepoxide.

9. The epoxy resin of claim 8 wherein the second polyol component comprises a compound selected from the group consisting of trimethylolpropane, ethoxylated trimethylolpropane, propoxylated trimethylolpropane and tricyclodecanedimethanol.

10. The epoxy resin of claim 9 wherein the filler comprises a translucent fused quartz filler.

11. The epoxy resin of claim 10 wherein the epoxide component comprises a compound selected from the group consisting of an epoxidated olefin, an epoxidated diolefins and an expoxidated polyolefin.

12. The epoxy resin of claim 11 wherein the initiator comprises a triarylsulfonium salt and a benzylthiolanium salt.

* * * * *